(12) United States Patent
Castillo-Aguilella et al.

(10) Patent No.: US 10,672,926 B2
(45) Date of Patent: Jun. 2, 2020

(54) FRAMELESS PV-MODULE

(71) Applicant: PRISM SOLAR TECHNOLOGIES, INC., Highland, NY (US)

(72) Inventors: Jose E Castillo-Aguilella, Tucson, AZ (US); Paul S Hauser, Tucson, AZ (US)

(73) Assignee: Prism Solar Technologies, Inc., Highland, NY (US)

( * ) Notice: Subject to any disclaimer, the term of this patent is extended or adjusted under 35 U.S.C. 154(b) by 49 days.

(21) Appl. No.: 15/886,638

(22) Filed: Feb. 1, 2018

(65) Prior Publication Data

US 2018/0166600 A1 Jun. 14, 2018

Related U.S. Application Data

(63) Continuation of application No. 14/831,651, filed on Aug. 20, 2015, now Pat. No. 10,186,624, which is a continuation-in-part of application No. 14/488,564, filed on Sep. 17, 2014, now Pat. No. 9,312,418, which is a continuation of application No. 13/775,744, filed (Continued)

(51) Int. Cl.
*H01L 31/048* (2014.01)
*H01L 25/04* (2014.01)
*H01L 31/042* (2014.01)
*H01L 31/02* (2006.01)
(Continued)

(52) U.S. Cl.
CPC ........ *H01L 31/0488* (2013.01); *H01L 25/043* (2013.01); *H01L 31/02013* (2013.01); *H01L 31/042* (2013.01); *H01L 31/048* (2013.01);

*H02S 40/22* (2014.12); *H02S 40/34* (2014.12); *Y02B 10/12* (2013.01); *Y02E 10/52* (2013.01)

(58) Field of Classification Search
CPC .................................................. H01L 31/0488
See application file for complete search history.

(56) References Cited

U.S. PATENT DOCUMENTS 7,829,783 B2 11/2010 Krajewski et al.
8,853,525 B2 10/2014 Beckerman et al.
(Continued)

FOREIGN PATENT DOCUMENTS

WO 2010100948 A1 9/2010

OTHER PUBLICATIONS

A comparison of solar panel cell technology, The Power of Redarc, accessed Jun. 14, 2019 (Year: 2019).*
(Continued)

*Primary Examiner* — Shannon M Gardner
(74) *Attorney, Agent, or Firm* — Heslin Rothenberg Farley & Mesiti P.C.; Victor A. Cardona, Esq.

(57) ABSTRACT

A photovoltaic module employing an array of photovoltaic cells disposed between two optically transparent substrates such as to define a closed-loop peripheral area of the module that does not contain a photovoltaic cell. The module is sealed with a peripheral seal along the perimeter; and is devoid of a structural element affixed to an optically transparent substrate and adapted to mount the module to a supporting structure. The two substrates may be bonded together with adhesive material and, optionally, the peripheral seal can include the adhesive material. The module optionally includes diffraction grating element(s) adjoining respectively corresponding PV-cell(s).

24 Claims, 13 Drawing Sheets

Related U.S. Application Data on Feb. 25, 2013, now Pat. No. 8,853,525, and a continuation-in-part of application No. 13/675,855, filed on Nov. 13, 2012, now abandoned.

(60) Provisional application No. 61/728,641, filed on Nov. 20, 2012, provisional application No. 61/728,645, filed on Nov. 20, 2012, provisional application No. 61/728,633, filed on Nov. 20, 2012, provisional application No. 61/563,339, filed on Nov. 23, 2011, provisional application No. 61/562,654, filed on Nov. 22, 2011, provisional application No. 61/560,381, filed on Nov. 16, 2011, provisional application No. 61/559,980, filed on Nov. 15, 2011, provisional application No. 61/559,425, filed on Nov. 14, 2011.

(51) Int. Cl.
*H02S 40/22* (2014.01)
*H02S 40/34* (2014.01)

(56) References Cited

U.S. PATENT DOCUMENTS

| | | | |
|---|---|---|---|
| 9,312,418 | B2 | 4/2016 | Beckerman et al. |
| 2003/0116185 | A1 | 6/2003 | Oswald |
| 2006/0207646 | A1 | 9/2006 | Terreau |
| 2008/0066801 | A1 | 3/2008 | Schwartze |
| 2008/0185033 | A1 | 8/2008 | Kalejs |
| 2008/0257400 | A1 | 10/2008 | Mignon |
| 2008/0289682 | A1* | 11/2008 | Adriani ............ B32B 17/10018 136/251 |
| 2009/0151776 | A1 | 6/2009 | Schindler |
| 2010/0206365 | A1 | 8/2010 | Chumney et al. |
| 2010/0212658 | A1 | 8/2010 | Moller |
| 2011/0019349 | A1 | 1/2011 | Pfeffer |
| 2011/0315191 | A1 | 12/2011 | Takanashi et al. |

OTHER PUBLICATIONS

HIT Double Bifacial Photovoltaic Modules, Sanyo Energy (USA) Corp., May 1, 2007.
First Solar FS Series 2 PV Module, Thin Film Solutions for High Performance PV Systems, First Solar, PD-5-401-02 NA May 2011.

\* cited by examiner

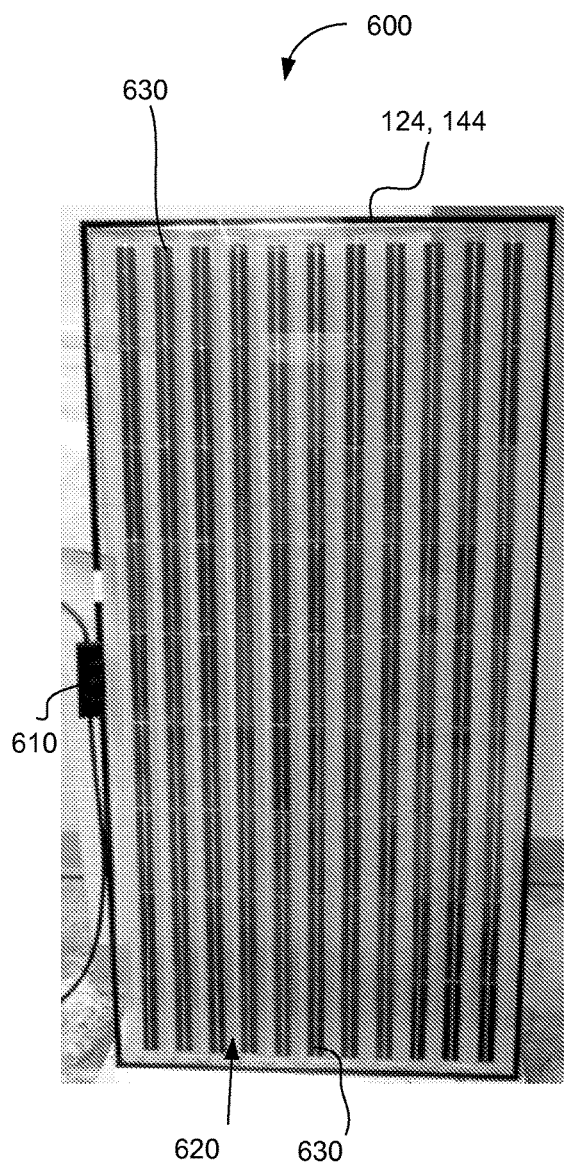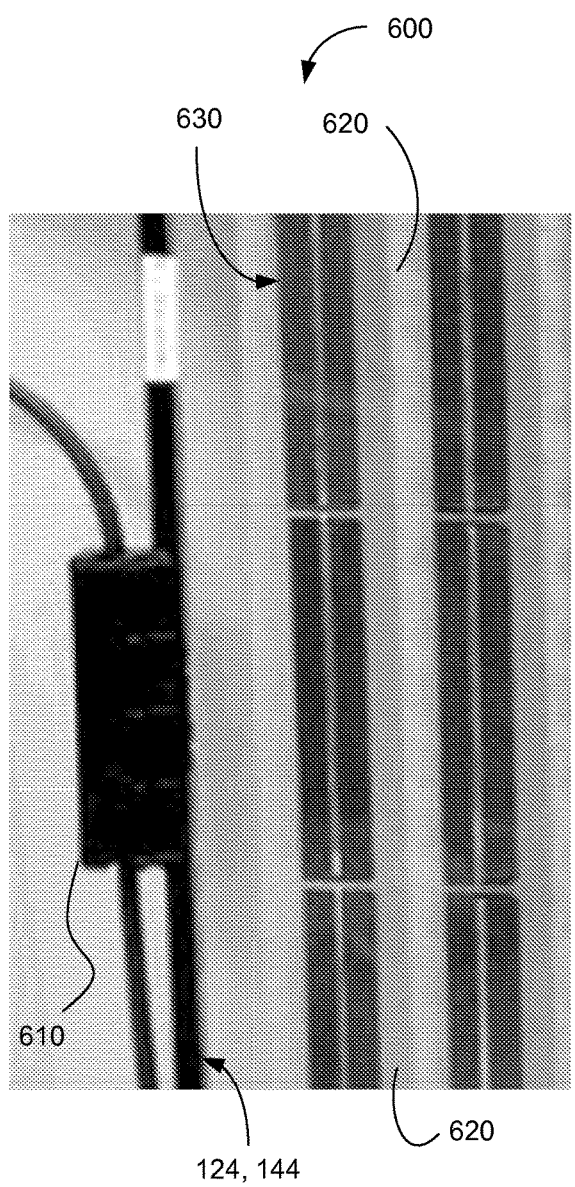
FIG. 6A
FIG. 6B

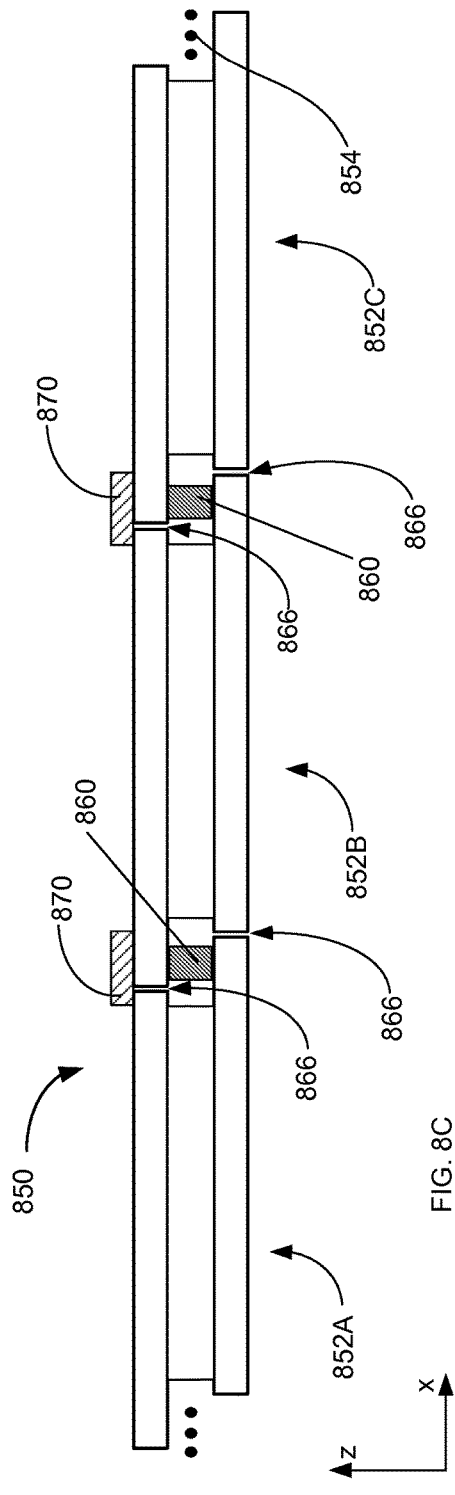
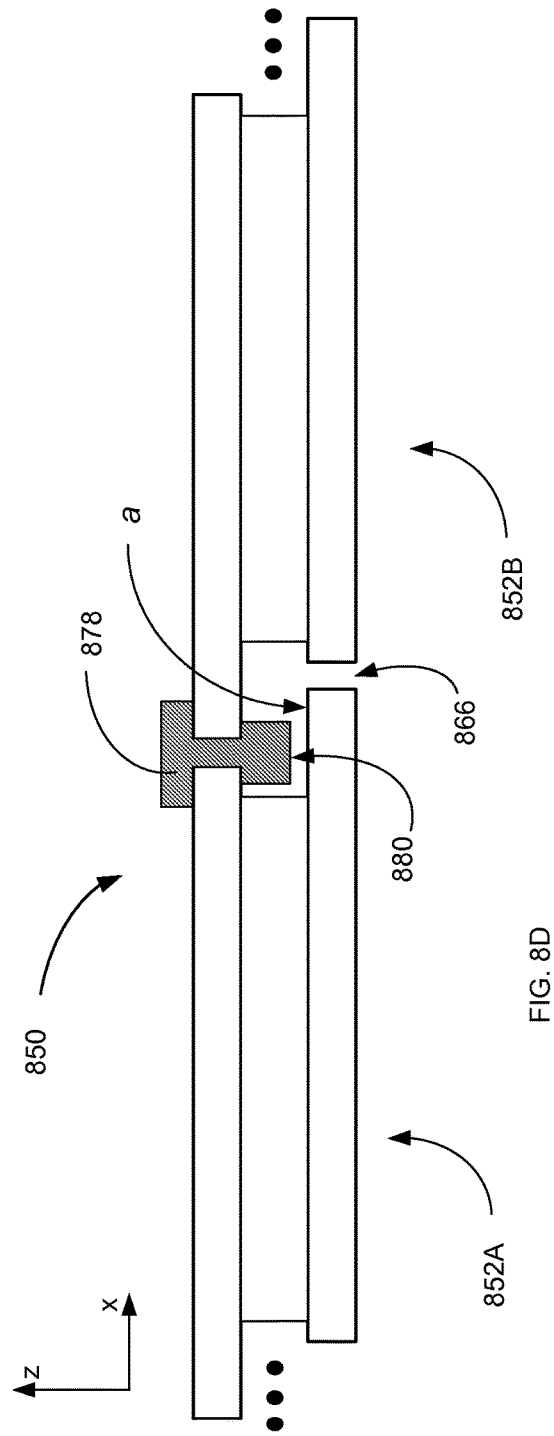

FRAMELESS PV-MODULE

CROSS-REFERENCE TO RELATED APPLICATIONS

This application is a continuation of U.S. Ser. No. 14/831,651 filed on Aug. 20, 2015, published as U.S. Publication No. 2015/0357495 A1 on Dec. 15, 2015, which is a continuation-in-part of U.S. Ser. No. 14/488,564 filed on Sep. 17, 2014, now U.S. Pat. No. 9,312,418 issued on Apr. 12, 2016, which is a continuation of U.S. Ser. No. 13/775,744 filed Feb. 25, 2013, now U.S. Pat. No. 8,853,525 issued on Oct. 7, 2014, which claims priority from U.S. Provisional Patent Applications Nos. (a) 61/728,633 filed on Nov. 20, 2012; (b) 61/728,641 filed on Nov. 20, 2012; and (c) 61/728,645 filed on Nov. 20, 2012, the entire disclosures of which are incorporated herein by reference in their entirety.

U.S. Ser. No. 14/488,564 filed on Sep. 17, 2014, now U.S. Pat. No. 9,312,418 issued on Apr. 12, 2016, is also a continuation-in-part of abandoned U.S. Ser. No. 13/675,855 filed on Nov. 13, 2012 and titled "Flexible Photovoltaic Module", which claimed priority from U.S. Provisional Patent Applications Nos. (a) 61/559,425, filed on Nov. 14, 2011; (b) 61/559,980 filed on Nov. 15, 2011; (c) 61/560,381, filed on Nov. 16, 2011; (d) 61/562,654 filed on Nov. 22, 2011; and (e) 61/563,339 filed on Nov. 23, 2011, the entire disclosures of which are incorporated herein by reference in their entirety.

TECHNICAL FIELD

The present invention relates to photovoltaic (PV) conversion of solar radiation and, in particular, to a PV modules or panel that is devoid of a structural frame and/or electrically-grounding element.

BACKGROUND

Solar energy will satisfy an important part of future energy needs. While the need in solar energy output has grown dramatically in recent years, the total output from all solar installations worldwide still remains around 178 GW, which is only a tiny fraction of the world's energy requirement. High material and manufacturing costs, low solar module efficiency, and shortage of refined silicon limit the scale of solar power development required to effectively compete with the use of coal and liquid fossil fuels.

The key issue currently faced by the solar industry is how to reduce system cost. The main-stream technologies that are being explored to improve the cost-per-kilowatt of solar power are directed to (i) improving the efficiency of a solar cell that comprises solar modules, and (ii) delivering greater amounts of solar radiation onto the solar cell. In particular, these technologies include developing thin-film, polymer, and dye-sensitized photovoltaic (PV) cells to replace expensive semiconductor material based solar cells, the use high-efficiency smaller-area photovoltaic devices, and implementation of low-cost collectors and concentrators of solar energy.

The most common type of a photovoltaic panel in the market is a panel including with an (optionally) tempered glass frontsheet, a flexible backsheet, monofacial PV elements or cells, and surrounded with a structural frame adapted to impart rigidity on the overall construction and facilitate mechanical attachment of the panel to a supporting structure such as a foundation, a roof of a building, or an opening in a wall or ceiling.

By configuring a PV module without a frame while not compromising the structural integrity of the module, the cost of the module and installation of the module is significantly reduced. Moreover, however, the frameless module is easier to integrate into structures already used in the glass and construction industry (as compared to the module possessing the frame), thereby making the frameless module easier to use in architectural applications, for example (such as windows or skylights).

SUMMARY

Embodiments of the present invention provide a photovoltaic (PV) module that includes (a) a first optically transparent substrate having first longitudinal extent defined by first and second edges that are substantially parallel to one another, and first transverse extent defined by third and fourth edges that are substantially parallel to one another; and (b) a second optically transparent substrate having second longitudinal extent defined by fifth and sixth edges that are substantially parallel to one another, and second transverse extent defined by seventh and eighth edges that are substantially parallel to one another. In such configuration, at least one of the following conditions is satisfied: (i) a first line representing a normal projection of the first edge on a plane defined by the second substrate is substantially parallel to and separated from a line representing the fifth edge; and (ii) a second line representing a normal projection of the third edge on a plane defined by the second substrate is substantially parallel to and offset by a second distance from a line representing the seventh edge. The module additionally includes one or more first PV cells disposed in a volume between the first and second substrates; and, optionally, a first flexible sealing material disposed between the first and second substrates along a perimeter of the second substrate to sealingly attach said substrates to one another. In a specific case, such PV module is devoid of at least one of (i) substantially rigid housing element and (ii) an electrically-conducting grounding element (which term refers generally to a grounding wire or clamp conventionally configured to electrically attach the module to the racking structure on which the module is mounted. In one implementation, the first and second substrate include congruent curved plates. One or more first PV cells are electrically interconnected with one another to define an array of PV cells. Such array has transverse dimensions at least one of which is smaller than a transverse dimension of the PV module, and (when the first flexible material is present) is disposed within bounds of the first flexible sealing material to define a peripheral portion of the first volume. The peripheral portion is devoid of a PV cell.

In a specific implementation, the PV module may further include a third optically transparent substrate layer having (i) first longitudinal extent defined by ninth and tenth edges that are substantially parallel to one another, and (i) first transverse extent defined by eleventh and twelfth edges that are substantially parallel to one another; wherein the first substrate and the third substrate layer are disposed in parallel to one another and on opposite sides of the second substrate. In such configuration, a first polygon representing a normal projection of a perimeter of the first substrate on the plane defined by the second substrate is substantially co-extensive with a second polygon representing a normal projection of a perimeter of the third substrate layer on such plane. This specific embodiment also includes one or more second PV cells disposed in a volume between the second substrate and the third substrate layer; and a second flexible sealing material disposed between the second substrate and the third substrate layer along a perimeter of the second substrate to sealingly attach the second substrate and the third substrate layer to one another.

Embodiments of the present invention also provide a photovoltaic (PV) module that contains first and second congruent substrates disposed in a spaced-apart and tangentially-parallel relationship in first and second planes, respectively; and a PV layer between the first and second substrates, which PV layer contains at least one PV cell. Here, an outer surface of the first substrate defined by first and second surface portions; an outer surface of the second substrate defined by third and fourth portions. The PV module is dimensioned such that, when viewed along an axis that is perpendicular to both the first and second planes: (a) the first portion does not overlap with any portion of the second substrate; (b) the second and third portions overlap one another, and (c) the fourth portion does not overlap with any portion of the first substrate. The first and fourth portions may be defined on opposite sides of the PV layer. In a specific case, an area of the PV layer is equal to or smaller than the area of the second portion. The embodiment may also include a first flexible sealing material disposed between the first and second substrates along a perimeter of the second substrate to sealingly attach the substrates to one another. Alternatively or in addition, the PV module may be configured to be devoid of at least one of substantially rigid housing element and an electrically-grounding element.

BRIEF DESCRIPTION OF THE DRAWINGS

Embodiments of the invention will be better understood in conjunction with the following generally-not-to-scale Drawings, of which:

FIG. 6A shows an embodiment of the invention containing holographic elements and edge-mounted junction box;

FIG. 6B is a close-up view of the embodiment of FIG. 6A;

FIG. 8C is a diagram schematically showing an array of PV modules each of which is configured according to the embodiment of FIGS. 8A, 8B;

FIG. 8D is a diagram illustrating a related embodiment of an array of PV modules;

DETAILED DESCRIPTION

Figure 1A:
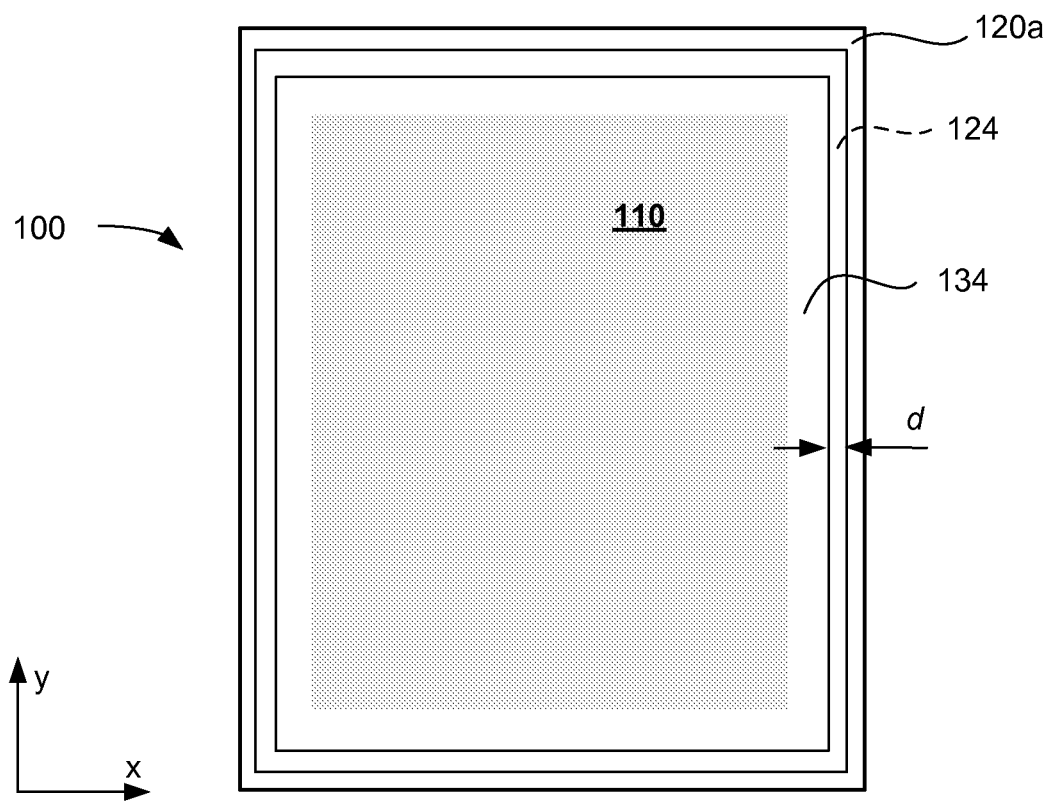
FIG. 1A is a diagram showing schematically top view of an embodiment of the invention.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, the following disclosure may describe features of the invention with reference to corresponding drawings, in which like numbers represent the same or similar elements wherever possible. In the drawings, the depicted structural elements are generally not to scale, and certain components are enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

Moreover, if the schematic flow chart diagram is included, it is generally set forth as a logical flow-chart diagram. As such, the depicted order and labeled steps of the logical flow are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Without loss of generality, the order in which processing steps or particular methods occur may or may not strictly adhere to the order of the corresponding steps shown.

The invention as recited in claims appended to this disclosure is intended to be assessed in light of the disclosure as a whole, including features disclosed in documents to which reference is made.

As broadly used and described herein, the reference to a layer as being "carried" on or by a surface of an element refers to both a layer that is disposed directly on the surface of that element or disposed on another coating, layer or layers that are, in turn disposed directly on the surface of the element. A "laminate" refers generally to a compound material fabricated through the union of two or more components, while a term "lamination" refers to a process of fabricating such a material. Within the meaning of the term "laminate," the individual components may share a material composition, or not, and may undergo distinct forms of processing such as directional stretching, embossing, or coating. Examples of laminates using different materials include the application of a plastic film to a supporting material such as glass, or sealing a plastic layer between two supporting layers, where the supporting layers may include glass, plastic, or any other suitable material.

For the purposes of this disclosure and the appended claims, the use of the term "substantially" as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. The use of this term in describing a chosen characteristic or concept neither implies nor provides any basis for indefiniteness and for adding a numerical limitation to the specified characteristic or descriptor. For example, a reference to a vector or line or plane being substantially parallel to a reference line or plane is to be construed as such vector or line extending along a direction or axis that is the same as or very close to that of the reference line or plane (with angular deviations from the reference direction or axis that are considered to be practically typical in the art, in one example—between zero and fifteen degrees). A term "substantially-rigid", when used in reference to a housing or structural element providing mechanical support for a contraption in question, generally identifies the structural element that rigidity of which is higher than that of the contraption that such structural element supports. As another example, the use of the term "substantially flat" in reference to the specified surface implies that such surface may possess a degree of non-flatness and/or roughness that is sized and expressed as commonly understood by a skilled artisan in the specific situation at hand.

Embodiments of the invention utilize either single-sided PV cells (also referred to as monofacial PV cells) or bifacial PV cells. A bifacial photovoltaic cell allows for harvesting of solar energy from both the front and the back sides of the cell substantially without changing the structure of the cell. Bifacial solar cells that are currently available commercially are known to generally have unequal efficiencies of solar energy conversion associated with the front and back sides of an individual PV cell. It is appreciated, when such unequal-efficiency bifacial PV cells (UEB-cells) are assembled into conventional panels or series such that the "front" or "first" sides (high efficiency sides) of all the cells are oriented to intercept direct sunlight, while the lower efficiency or "back" sides are oriented to receive sunlight delivered indirectly (from scatter, reflection off of the ground, or mounting surface, for example), the electrical energy output from the resulting PV panels or modules is not optimized. The PV modules containing bifacial cells are usually positioned with the side of a cell having higher efficiency generally facing south (in the northern hemisphere), to capture the maximum amount of direct solar radiation possible. Embodiments of a PV module utilizing structurally different disposition of UEB-cells has been disclosed in a co-assigned U.S. patent application Ser. No. 13/743,122, the entire disclosure of which is incorporated herein by reference.

Optionally, embodiments of the present invention employ at least one diffractive optical component that includes a layered structure with a diffraction grating that may be disposed in optical communication with a PV-cell of the module and be co-planar with such PV-cell. Such layered structure rating lends itself to being produced in a stamped roll-to-roll process.

Conventionally used PV modules utilize a structural frame to supplement and increase the rigidity afforded by lite(s) of glass (also referred to herein as substrates and superstrate) in juxtaposition with which the PV cells are disposed, while also providing a small measure of environmental protection through the bonding agent of the frame to the module (Silicone sealant, edge tape, etc.).

In contradistinction with the conventional design, embodiment of a PV module according to the present invention is adapted to utilize the rigidity afforded by two laminated sheets of glass or transparent plastic (interchangeably referred to herein as "substrates", between which the electrically connected PV cells and, optionally, auxiliary diffractive optical elements are sandwiched) and is devoid of any structural frame that is external to the substrates. The thickness of an individual substrate may vary, and generally depends on the structural rigidity required by the application. For example, in a specific architectural application a substrate unit made of laminated to one another lites of glass can be as thick as ¾ mm or more, while more generally, each glass sheet used in the fabrication of the embodiment is about 3.2 mm in thickness, resulting in a total module thickness of approximately 7.2 mm. In applications that require a higher load resistance (such as modules structured to operate in hurricane zones, skyscrapers, or where the glass itself is to be used to support part of the structural load), an appropriately thicker glass would be used, as shown in the example of pilkington.com/resources/brglass-mechanicalstrengthpdf.pdf.

According to one implementation of the invention, an array (whether a linear array or a two-dimensional) of operably-connected PV-cells is formed and sandwiched (and, optionally, encapsulated with (for example, embedded in) appropriate encapsulating material, as discussed elsewhere in this application) in a gap formed between at least two transparent substrates disposed in a substantially parallel and spaced-apart relationship. The array of PV-cells is housed in this gap. In order to increase a degree of protection of the PV-cell-containing environment of the gap from the external influence (such as ambient moisture, for example), a peripheral seal can be optionally added along the perimeter of the resulting unit (in one case—between the constituent substrates and not extending outside of the substrates, such as to sealingly affix these substrates to one another. While the examples of embodiments provided below do include the description of a peripheral seal, it is understood that implementations without such peripheral seal are also within the scope of the invention. In one embodiment, the peripheral seal forms a ring of substantially moisture proof seal along the edges of the two substrates of the PV module. Such seal may be formed from a conforming elastic material that facilitates environment-caused changes in mutual positioning and/or dimensions of the unit (for example, the expansion of the components of the unit due to heat).

Figure 1B:
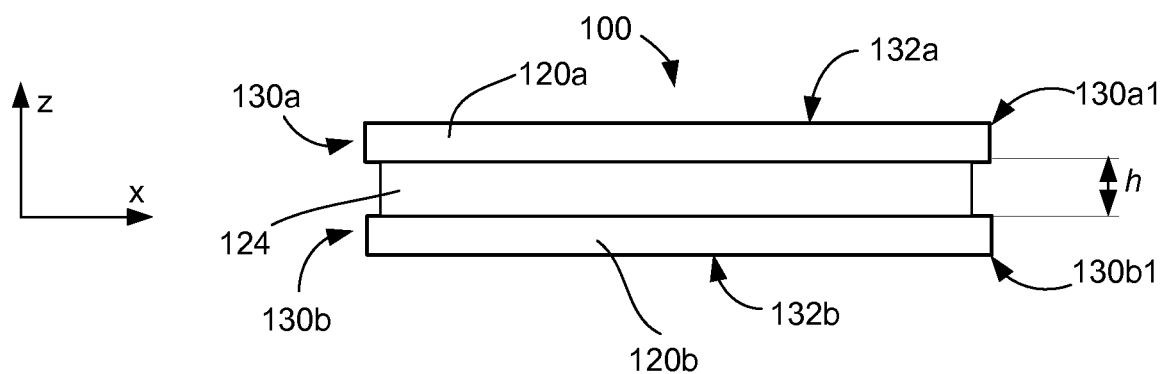
FIG. 1B is a side view of an embodiment of the invention.

A non-limiting example of the PV module 100 of the invention is shown, in front and side views, in FIGS. 1A, 1B. Here, a group of PV-cells (formed by one or more of the PV cells, in the latter case optionally arranged in an ordered array of PV cells) and associated electrical busses (arranged as discussed later in reference to the embodiments of the present invention, for example embodiments 400, 500) is generally denoted with a shaded area 110 and disposed between the two substantially parallel lites of glass 120a, 120b that are optionally sealingly affixed to one another with a perimeter seal 124 disposed between the lites 120a, 120b in a peripheral portion of the unit 100. (Any of these constituent lites of glass can be interchangeably referred to as a "substrate" or, alternatively, the lite that is lower lite in a given orientation is referred to as a substrate while the lite that is upper lite in such orientation may be referred to as superstrate. Alternatively, the substrate corresponding to the front of the module—that is, the substrate facing the Sun in operation—may be referred to as a "front sheet", while the substrate disposed on the opposite outer side of the module may be referred to as a "back sheet".) The perimeter seal (or, edge seal barrier) 124 may be optically opaque, translucent, or transparent and made of material such as, for example, desiccated edge seal (such as the seal with dessicated silica particles in a rubber matrix), silicone or other materials Optionally, this peripheral or perimeter seal along the perimeter of a lite of a substrate or superstrate of the module can include the same material that is used in the adhesive bonding the substrate and superstrate of the PV module together. Examples of appropriate encapsulating materials include EVA, PVB, and thermoplastics such as Surlyn. The front surface of the module (that is, the surface facing the Sun in operation) is denoted as surface 132a, while the back surface of the module is denoted as surface 132b. The peripheral area 134 of the PV module that does not contain a PV cell (if such area is present or available in a specific embodiment) is defined as an optically transparent closed band portion, of the substrates (120a, 120b). In one example, the width of this peripheral area 134 on each side of the area 110 is substantially equal to half a difference between a transverse dimension of the area 110 and a transverse extent of the PV module 100. In a related embodiment (not shown) the peripheral area 134 can be configured to be asymmetric in that on one side of the area 110 the band 134 has a first width while on the opposite side of the area 110 the band 134 has a second width that differs from the first width. In another example, such width is smaller or bigger than the above-mentioned half a difference.

The edge seal barrier 124, when present, is defined around the periphery of the module, substantially in the same layer as the PV cells of the module. In one implementation, the edge seal barrier 124 is about 1 mm.+−0.0.5 mm in height (parameter h in FIG. 1B) and between about 2 and about 20 mm in width (parameter d in FIG. 1A), depending on the application. An embodiment of the PV modules laminated with encapsulating materials that differ from the industry standard ethylene-vinyl acetate (EVA) (such as, for example, Dupont's Surlyn or other iononer/thermoplastic or silicone based materials), may not necessarily require such edge seal protection.

Generally, the perimeter seal 124 is shaped as a closed loop or ring with a width d sufficient to make the seal substantially impenetrable to the ambient atmosphere and moisture. In FIGS. 1A, 1B the seal 124 is shown to be disposed on the inboard side of the substrates 120a, 120b with a small offset with respect to the edges and/or edge surfaces of the substrates (edge surfaces 130a, 130b, edges 130a1, 130b1 for example). An edge of a substrate of a PV module is defined by an intersection of an edge surface with a top surface or a bottom surface of the substrate. In a related embodiment, however (not shown) the perimeter seal may be sized such that a dimensional extent of the seal is substantially equal to a dimensional extent of the PV module. For example, an overall width of the seal 124 may be substantially equal to the overall width of the unit 100 and/or an overall length of the seal 124 may be substantially equal to the overall length of the unit 100. In such an embodiment, the peripheral/perimeter seal 124 is disposed substantially "flush" with the edges of the module such as edges 130a, 130b (in which case the small offset shown in FIGS. 1A, 1B is not present). The PV-module such as the module 100 is preferably devoid of any structural frame around the perimeter of the module. In other words, there is no housing element (which term refers, generally, to a rigid housing or frame-like supporting element or other structure affixed to the embodiment of FIGS. 1A, 1B to add or increased the rigidity of the embodiment).

Figure 1C:
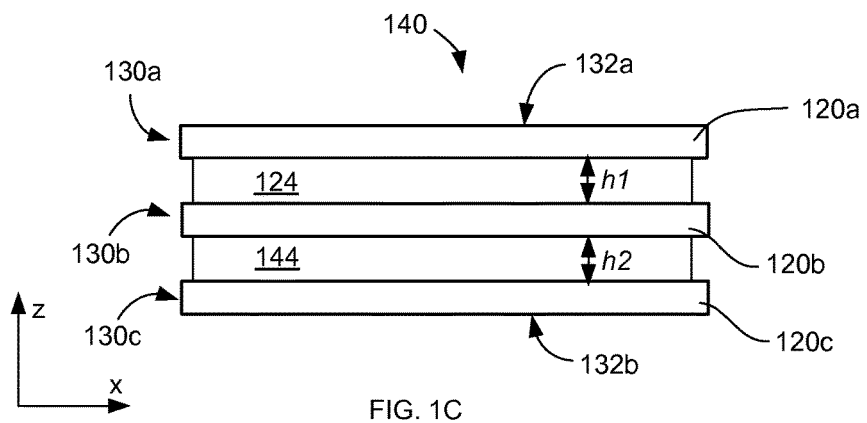
FIG. 1C is a side view of a related embodiment of the invention.

It is appreciated that an embodiment of a frameless PV module including more than two transparent substrates is also within the scope of the invention. As schematically illustrated in FIG. 1C in side view, the example of embodiment 140 of the module includes three optically transparent substrates 120a, 120b, 120c disposed in a spaced-apart and substantially parallel relationship such as to form a gap between any two immediately adjacent substrates. At least one of the two gaps formed between the three substrates contains PV cells that form, when viewed from the top, at least one PV-cell array. Each of the gaps is shown sealed with a corresponding peripheral seal (124, 144) disposed around the perimeter of the module 140 in fashion similar to that of the embodiment 100. In one implementation, individual PV cells that are disposed on one level (for example, between in the gap 124 the substrates 120a, 120b) are electrically connected to one another in a first pre-determined configuration to form a first PV cell array, while individual PV cells disposed on another level (if present; for example, between the substrates 120b, 120c) are electrically connected to one another in a second pre-determined configuration to form a second PV cell array.

Figure 1D:
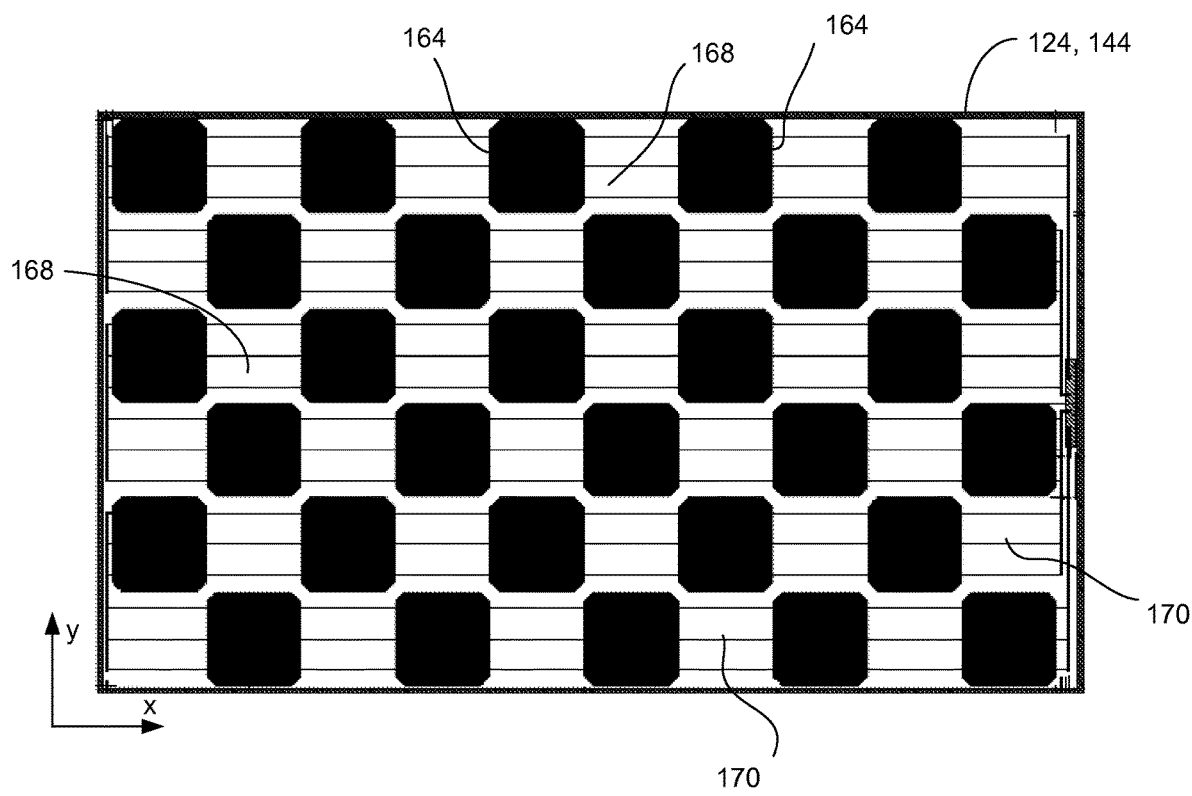
FIG. 1D is a diagram illustrating a top view of an embodiment with first arrangement of photovoltaic cells in an embodiment of the invention.

When both such PV cell arrays are present, the embodiment is referred to as a multi-level PV module. In this case, the first and second arrays may or may not be operably connected with one another (i.e., they may operate independently from one another). In the case of such multi-level PV module structure, the PV cells of the first array are preferably disposed such as to not, in operation, cast a shadow on or block from the sun the PV cells of the second array and vice versa. FIG. 1D, for example, provides a top plan view of a PV module 160 in which the individual PV cells 164 are arranged in a checker-board pattern. If in a multi-level variation of the embodiment 140 of the PV module discussed above the PV cells at the first level (between the substrates 120a, 120b) are organized according to the pattern of FIG. 1D, then the PV cells at the second level (between the substrates 120b, 130c) may be organized in a checker-board pattern that is complementary to the pattern of FIG. 1D. Specifically, the PV cells at the second level may be disposed at locations that, in the embodiment 160 correspond to the spacings 168 between the PV cells 164, while the spacings between the PV cells at the second level will spatially correspond to the PV cells at the first level. Elements 170 denote electrical bussing and/or wiring associated with PV cells of a given level.

Figure 1E:
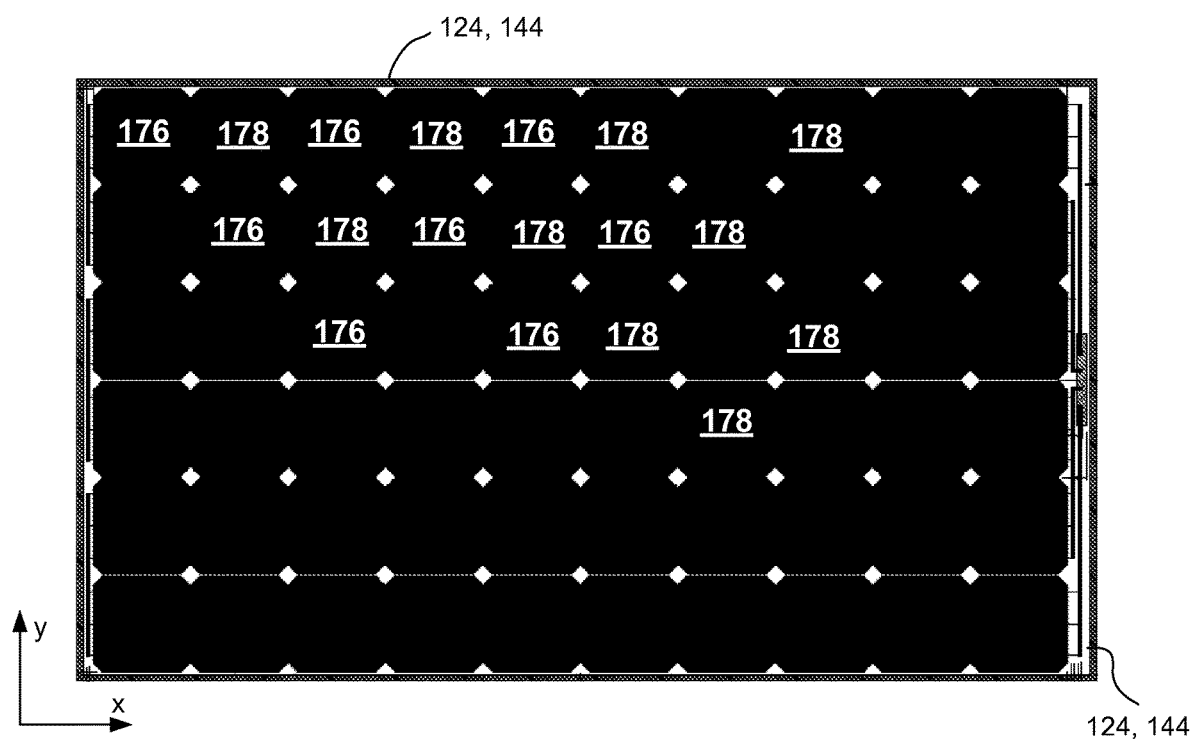
FIG. 1E is a diagram illustrating a top view of an embodiment with second arrangement of photovoltaic cells in an embodiment of the invention.

The top plan view of a related two-level embodiment 174, structured according to the principles depicted in FIGS. 1C and 1D but containing a different number of individual PV cells, is presented in FIG. 1E. Here, the elements 176 depict the PV cells at the first level of the embodiment 172 and the elements 178 depict the PV cells at the second level of the embodiment 172 as seen through the optically transparent substrates. For simplicity of illustration, only a few individual PV cells are numbered in FIG. 1E.

A PV module structured with front and back sheets made of glass (a "glass/glass PV module") has several inherent advantages when compared to conventional PV modules that employ flexible back sheets (made from, for example, a sheet of plastic material). These advantages include higher fire resistance, higher humidity and UV protection afforded for the internal components (such as PV cells, wiring, diffractive elements); high transparency and low optical birefringence of the PV module in operation; reduced and often eliminated "yellowing" of the substrate material (due to UV exposure); and a higher rigidity without the use of an integrated structural frame. The glass-to-glass construction is also desirable for building integrated applications in which laminated glass structures are required for structural/safety reasons. The glass/glass modules are laminated with the use of materials and techniques similar to those used for plate glass or safety glass lamination thereby allowing, with proper design, to use the embodiments of the PV modules of the invention in architectural applications. A typical laminated structure of a PV module includes a tempered glass substrate, adhesive, PV-cell-containing layer, a hologram layer (if applicable), adhesive, and tempered glass superstrate. The structure is laminated in a heated environment with vacuum and pressure applied to the structure progressively.

FIGS. 1E, 2, 3, and 4 are diagrams showing, in top views and in greater detail, related embodiments of a PV module (whether single- or multiple-level) configured according to the idea of the invention. The individual PV cells in these embodiments (whether arranged in ordered PV cell arrays or not) are disposed on a single level and/or, in addition or alternatively, on multiple levels of a corresponding PV module.

Figure 2:
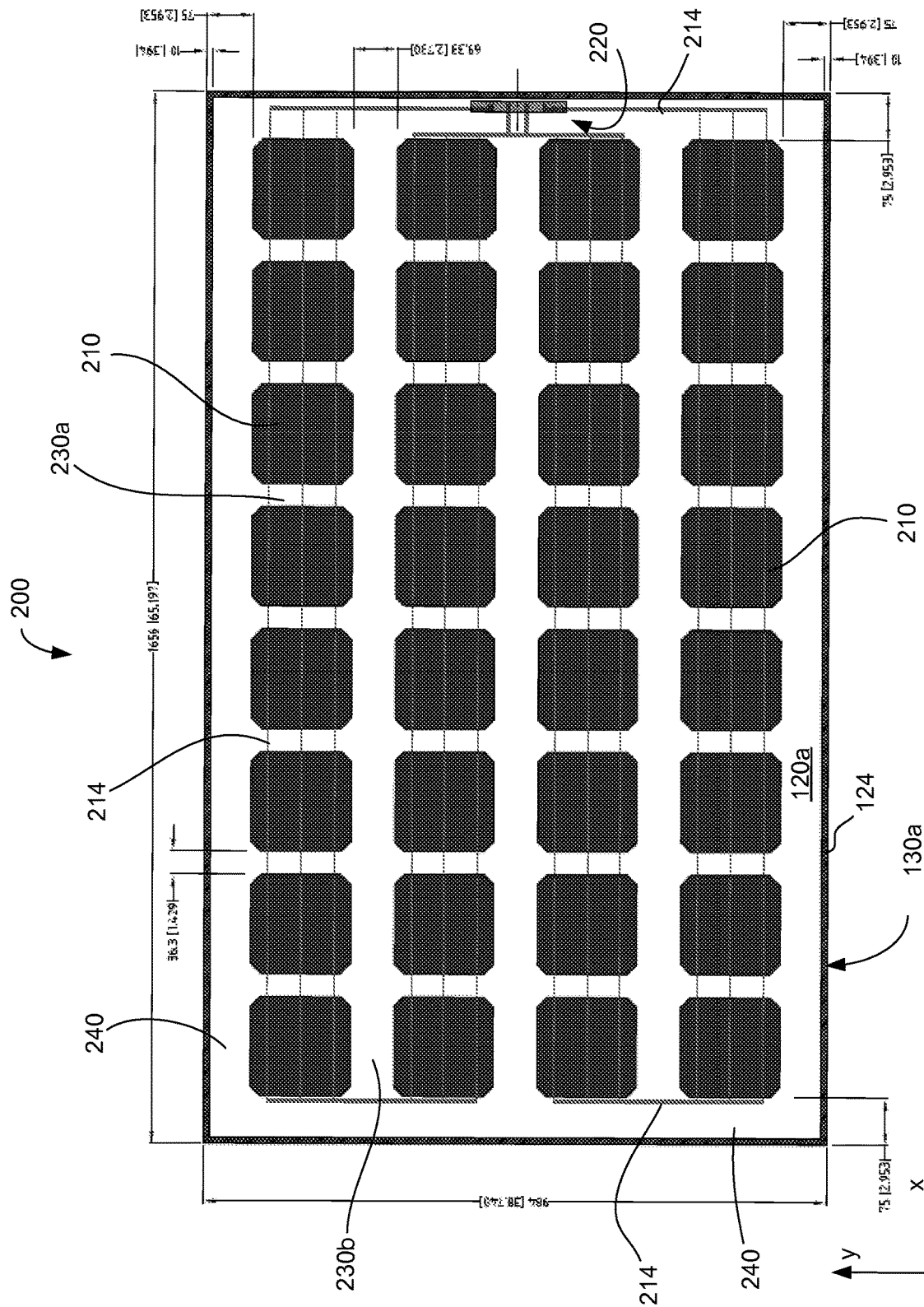
FIG. 2 is a diagram illustrating an alternative arrangement of photovoltaic cells in a related embodiment of the invention.

FIG. 2, for example, presents a top view of an embodiment 200 of the frameless PV module containing thirty two (32) PV cells 210 appropriately electrically connected with bussing or wiring 214 and arranged in a rectangular two-dimensional array disposed between at least two mutually-parallel lites of glass (such as lites 120a, 120b of FIGS. 1A, 1B). The electrical connections 214 operably lead to the junction box (or J-box) 220, which is used to interconnect the module with the external electrical wiring and systems and/or other modules. The cell-to-cell spacings 230a, 230b, separating the individual cells 210 in rows and columns, are appropriately controlled and dimensioned to ensure that a predetermined portion of sunlight incident onto the PV module 200 in operation through the front sheet is transmitted through the PV module 200 (i.e., through the lites 120a, 120b) to illuminate a scene behind the module 200, which is otherwise blocked from the Sun by the module 200.

A transparent area formed, as a closed band, around the array of the cells 210 between the edge 120a and the outer boundary of the array of the PV cells 210 (cell-to-edge separation or clearance), is optional. In an embodiment where such cell-to-edge separation is present, however, the structure of such peripheral transparent band preferably satisfies two conditions. On the one hand, the cell-to-edge separation may be sized to be greater (wider) than an extent of a portion of an external fixator (such as, for example, clamp or a like contraption) that overlaps with the module 200 and/or extends towards the PV cells 210 inward with respect to the edge (for example, edge 120a) of the module 200 when used in juxtaposition with the embodiment to attach the embodiment to a surrounding structure or support for proper operation. On the other hand, in addition or alternatively, the cell-to-edge separation may be sized to be greater (wider) than the extent of a shadow that such external fixator casts on the module during its typical time of operation. In applications in which the frameless PV module is to be used with external attachments or mounting systems that might shade the cells in the module (such as conventional mounting clips from traditional rooftop mounting PV systems, for example), the clearance around the edge of the module and the cells in the module is increased such as to account for the module-intruding shading and the shading caused by the height of the mounting elements as the sun moves throughout the day and season. The extent of the shadow cast can be estimated using the principles outlined, for example, in Thakkar, N., Cormode D., et al., "A simple non-linear model for the effect of partial shade on PV systems" (Photovoltaic Specialists Conference (PVSC), 2010 35th IEEE; Honolulu, Hi., IEEE: 002321-002326; 2010).

Figure 3:
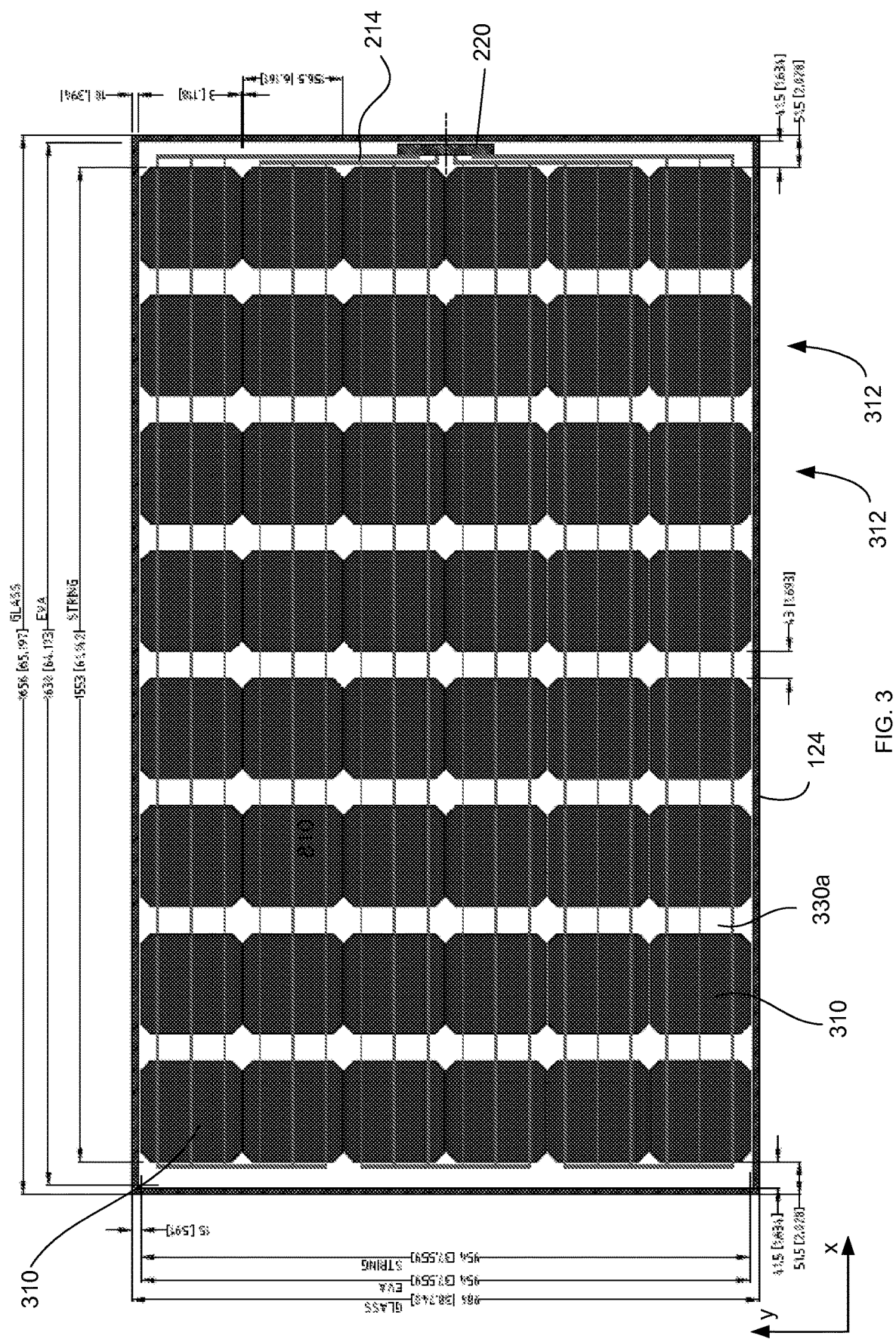
FIG. 3 is a diagram illustrating an alternative arrangement of photovoltaic cells in another related embodiment of the invention.

FIG. 3 illustrates a related embodiment 300, in which a two-dimensional array of PV cells 310 includes columns 312 (of PV cells) separated from one another by spacings 330 such that in each column 312 the immediately neighboring cells 310 are substantially adjoining each other. Again, as in the embodiment 200, the embodiment may be configured to include an optional cell-to-edge spacing (not shown).

Figure 4:
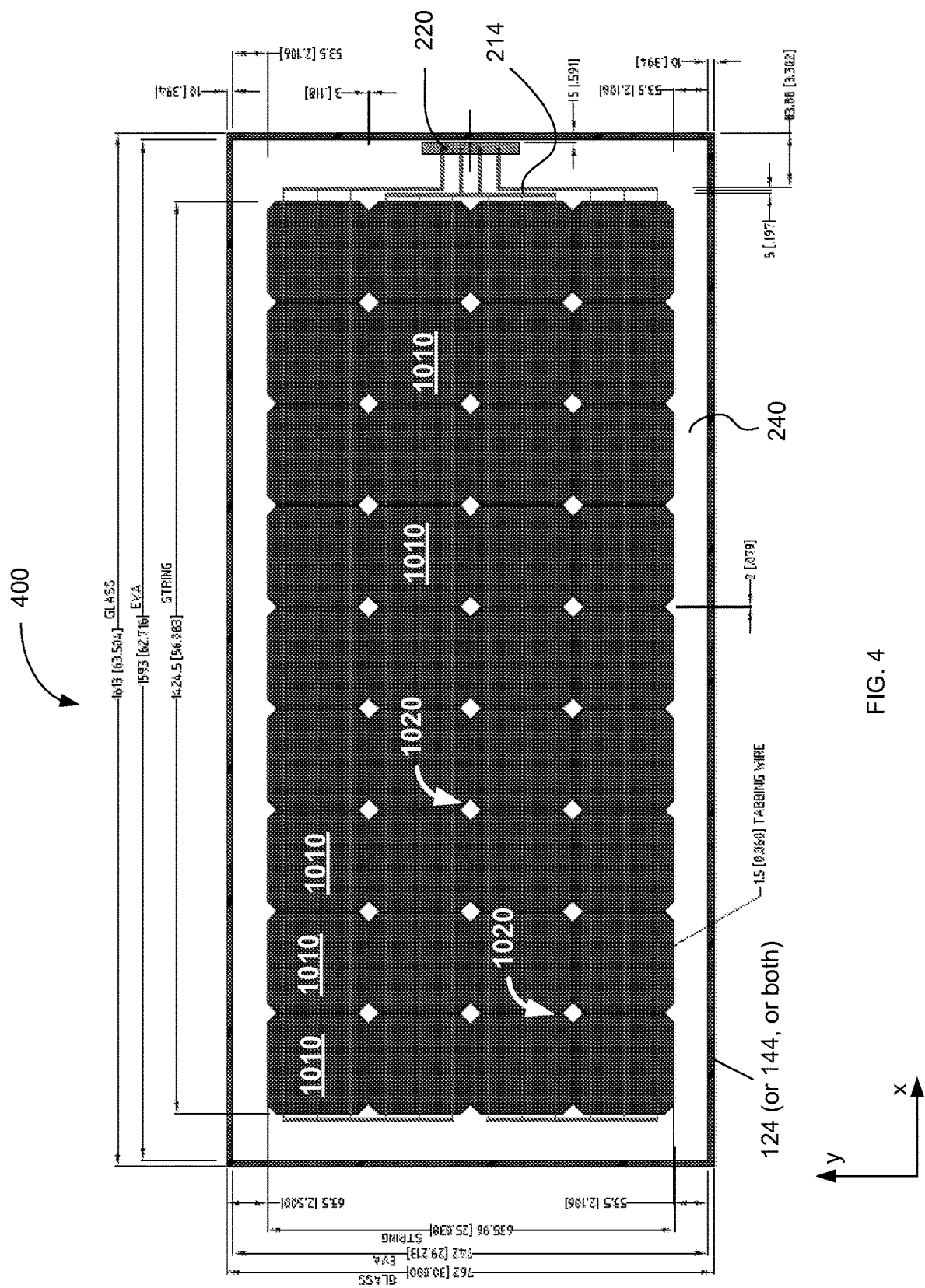
FIG. 4 is a top view of another embodiment of the invention showing an alternative arrangement of photovoltaic cells.

FIG. 4 illustrates a related embodiment 400, in which individual PV cells 410 are arranged in a two-dimensional array such that a given PV cell 410 is substantially adjoining each and every immediately neighboring PV cell, thereby leaving a minimal amount of spacing between or among the neighboring cells. Depending on the shape of individual PV cell, some small areas in the overall foot-print of the PV-module (such as, for example, areas 420) may remain substantially transmissive to sunlight incident substantially normally to the surface of the front or back surfaces 132a, 132b of the module 400.

Figure 5B:
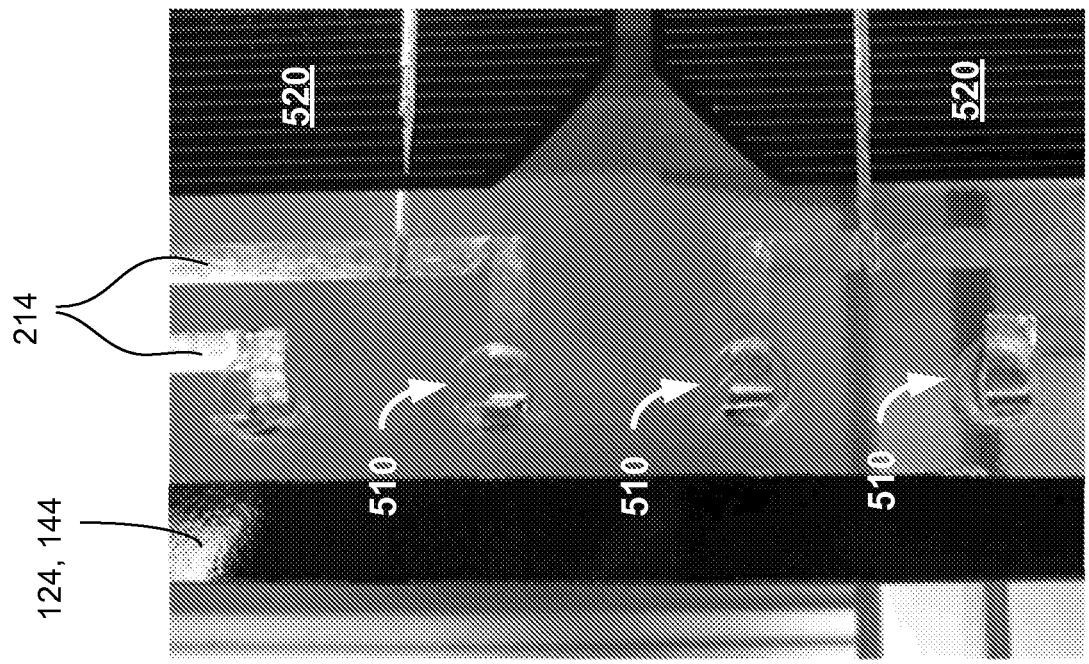
FIG. 5B shows a portion of an embodiment of the invention including the substrate of FIG. 5B, laminated with and integrated to photovoltaic cells, electrical connectors; and sealing material.
Figure 5A:
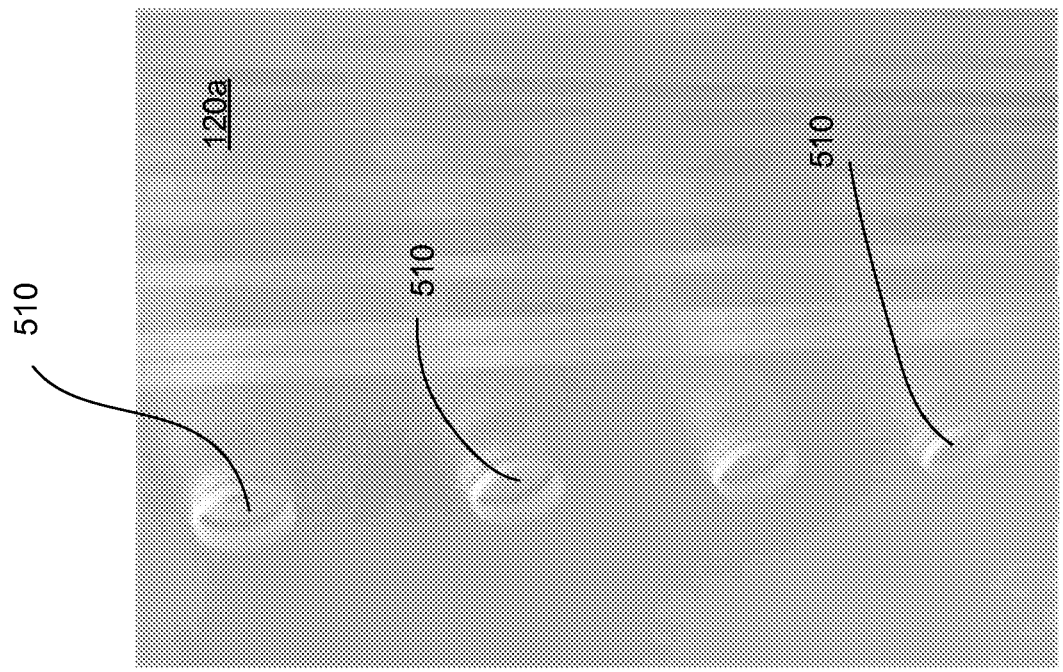
FIG. 5A shows a glass substrate containing vias (passes) therethrough for accommodating of electrical wiring elements of an embodiment of the invention.

In the embodiments of the invention that are structured to have wiring (or bussing, or electrical connectors) between the individual PV cells towards the back or front surface of the module for electrical interconnections (for example, to provide electrical contact(s) with a back-mounted junction box), the glass substrate/superstrate (for example, substrate 120a) may be configured to include openings 510. Such openings, if present, are judiciously dimensioned to allow the wiring to pass therethrough, as shown in FIGS. 5A, 5B. (FIG. 5A illustrates a substrate 120a with the openings 510 prior to assembly of the PV module; FIG. 5B shows a portion of the already-assembled and laminated PV module with PV cells 520 and bussing 214.) To form the opening, in one implementation sheets of glass are drilled or ablated to form through-holes in the precisely defined locations and then optionally tempered. The drilled holes 510 can be additionally and optionally treated to have mechanical stress relieved (with process(s) such as chamfering, grounding of edges and the like).

In reference to FIGS. 6A, 6B, on the other hand, in applications where the inter-PV-cell wires/connectors/busses are not required to be drawn or pulled through a substrate and/or superstrate of the PV module, the wiring or bussing 214 may be extended towards an externally disposed electrical circuitry (such as a junction box 610) through one of the sides and/or over the edge(s) of the module (for example, the edge 130a). The embodiments of FIGS. 6A, 6B additionally include internally-disposed holographically-defined diffractive optical layers or elements 620 in optical communication with corresponding PV cells 630. Examples of such diffractive elements, methods of their fabrication, and techniques for integration of these elements with other components of the PV module are described, for example, in U.S. patent application Ser. No. 13/682,119 the entire disclosure of which is incorporated herein by reference.

Figure 7:
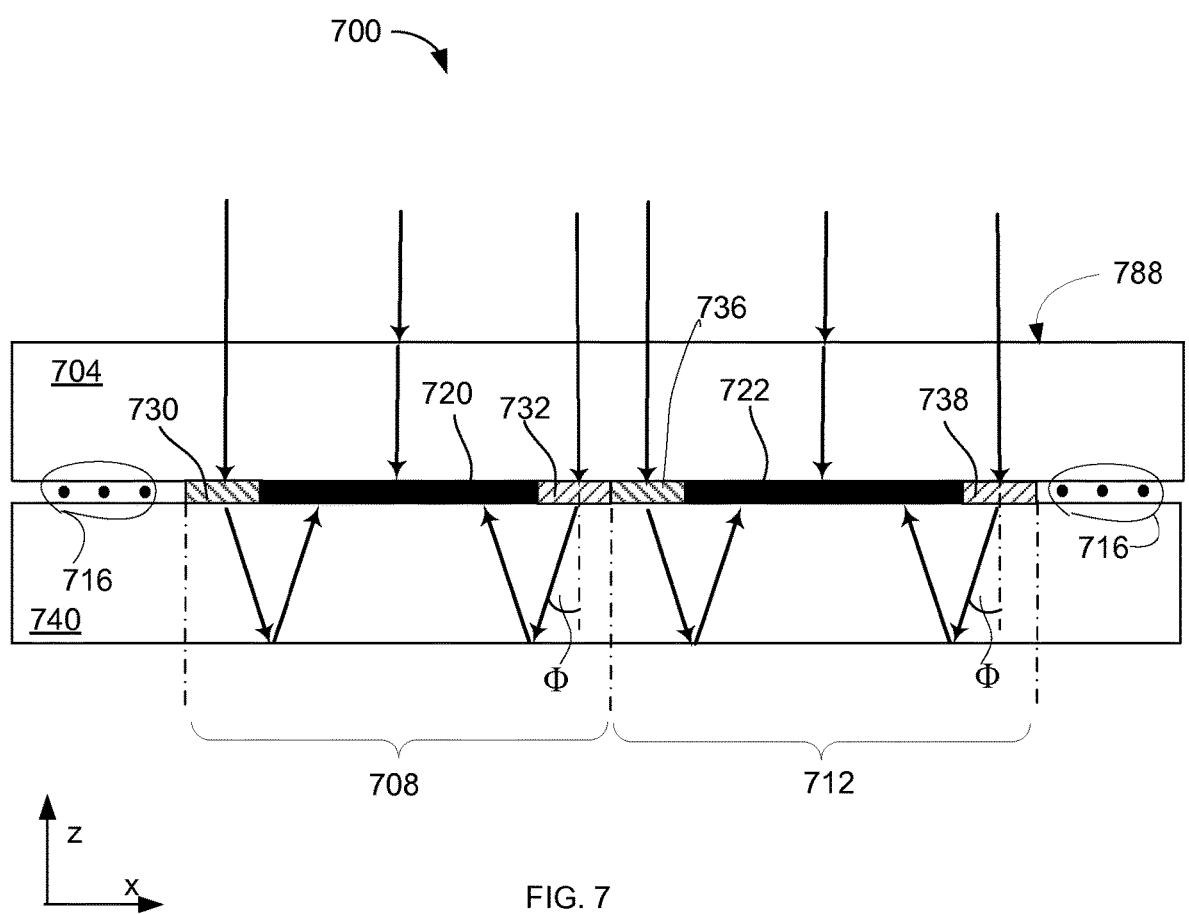
FIG. 7 is a simplified cross-sectional view showing schematically mutual disposition of photovoltaic cells and holographic elements in an embodiment of the invention.

A shown in a cross-sectional sketch representing a related embodiment 700 of FIG. 7, an embodiment may be a multi-portion (or multi-period) embodiment of a PV module and include first and second portions 708, 712. (Additional portions or periods, optionally present, are indicated with ellipses 716.) Each of the portions or periods 708, 712 contains a corresponding bifacial PV-cell or array of cells (720, 722) that is surrounded by (and substantially co-planar with) respectively-corresponding holographically-recorded diffraction grating layers (730, 732) or (736, 738). The holographic-grating-containing layers 730, 732, 736, 738 include, in one embodiment, transmissive bulk holographic diffraction gratings recorded in a dichromated gelatin layer. Pairs of the grating-containing layers can be cooperated with the corresponding bifacial PV-cell (on the sides of such cell) with or without spatial gaps separating them from the cell. Each of the grating-containing layers 730, 732, 736, 738 may be incorporated into an encapsulant layer which is used laminate bifacial PV-cells 720, 722 together with the corresponding pairs of gratings (730, 732) and (736, 738) to front and back covers 704, 740 of the embodiment. Various arrows in FIG. 1 indicate propagation of sunlight incident onto the surface 788 of the embodiment 700.

When an embodiment of the invention includes a PV-module containing bifacial PV cell(s), there exists a practical problem that the junction box of the module will block solar radiation from impinging onto at least one side of the PV cell. To obviate this common problem, in an embodiment of the invention the junction box is placed at the back of the module or in the vicinity of the edge of the module. The shading of the PV module is therefore minimized or even eliminated and the power loss associated with decreased local illumination (as well as possible detrimental effects such as extra heating, serially limiting the current in a string, and the like) is reduced. FIGS. 2-4, and 6A, 6B illustrate several examples of operably appropriate cooperation between the junction box (220, 610) and the PV cells (210, 310, 4101, 630). In implementation of frameless PV-modules that do not use bifacial cells or edge mounted junction boxes, a medium or large format junction box may be juxtaposed with a surface at the back of the module.

Some embodiments of a frameless PV-module (such as, for example, embodiments similar to the embodiments 200, 300) are structured to ensure that a portion of incident ambient light is converted into electrical power and a portion of such incident light is transmitted through the spacings (230a, 230b, 330a) between or among the cells thereby defining the PV module as being partially transmissive. So structured, an embodiment of a frameless PV-module of the invention is dimensioned, therefore, for use as part of a ceiling or windows in a building where it is desired to illuminate the interior of the building with natural light while utilizing sunlight for electrical power generation.

The overall light transmittance T through the so-structured frameless PV-module can be calculated as $T(\%) = 100\% \cdot [1 - R - A]$, where R and A denote reflectance and absorbance of sunlight by the module. Assuming a 4 A % reflection from glass and using the Beer-Lambert Law the transmittance value is rewritten as:

$$T(\%) = 100\% * 0.96 * -\alpha \cdot d * [1 - A_S + NA_C + AW + AJ] \quad \text{EQU00001}$$

Here, $\alpha$ is the absorption coefficient of the transparent areas of the PV module, d is the module thickness; $A_S$ is the area of an external to the frameless module supporting structure or fixator that casts shadow on the module; N is the number of PV cells; $A_C$ is an area of a single PV cell; $A_W$ is the area occupied by the electrical wiring (bussing, connectors); $A_J$ is the projected onto the module area of the J-box, and $A_z$ is the total area of the PV module.

In further reference to FIG. 2, and when the PV module employs bifacial PV cells, once the number of bifacial cells and the total module area are determined to achieve the desired transmission of sunlight through the module, and once the dimensions of the peripheral transparent area 240 are known, the extend and dimensions of the spacings 230a, 230b can be determined and varied to achieve various optical effects in light transmitted through the embodiment of the frameless module. For example, by making the horizontal and vertical spacings 230a, 230b substantially equally wide a substantially uniform illumination of the scene behind the PV-module can be achieved. Minimizing one of these widths while maximizing another causes the light to form, in transmission through the module, a regularly-spaced in one dimension pattern of light ("light columns"), as seen in FIG. 3, for example. As the skilled artisan will appreciate, various aesthetics possibilities can then be achieved within the constraints of the maxim transmittance possible.

As the light transmission of the PV module is increased, more light interacts with the surfaces behind the module and is scattered/reflected back towards the rear (with respect to the incident light) surface of the bifacial PV cells, thereby increasing the amount of energy produced per cell in the module. Modules produced with increased spacing between the cells will have a relatively larger surface area to radiate heat, lowering their temperature and again increasing the energy generated per cell.

As is readily appreciated by a skilled artisan, a problem of reliable interconnection between or among the individual PV modules remains. For example, "seam areas" between the interconnected modules remain, arguably, the weakest (in a structural sense) areas of the resulting arrayed contraption. In addition, in the case when arrays of interconnected modules are formed from the frameless modules, each of the constituent modules has to be maintained in a fixed spatial relationship with respect to the surrounding modules which, in turn, often begs for employment of a supporting structure such as a frame on the whole perimeter of a constituent module is rested.

The present invention additionally solves a persisting-in-the-art problem of forming a reliable structural connection between immediately-neighboring PV modules of a PV-module array. This is achieved by judiciously and intentionally structuring a constituent PV module of the array to have its substrates be transversely shifted with respect to one another (in a plane parallel to a plane of a given substrate) and positioning the neighboring PV modules with an intentional overlap between their corresponding transversely-shifted substrates. An appropriately dimensioned and intentionally-formed transverse shift between the substrates of a given module is configured along at least one of the spatial extents of such module, as discussed below. Generally, the substrates of an embodiment of the invention are congruent with one another, which term defines elements that are identical in form, or coinciding exactly when superimposed. In one implementation, the substrates may be plane-parallel plates such as glass plates with dimensions of W.times.L, where W is between 0.16 m and 1.6 m, while L is between 0.16 m and 2.5 m. In another implementation the substrates may be made of sheets of optically transparent plastic materials such as (width: 0.16 m to 1.6 m).times.(length: 0.16 m to 2.5 m). In a specific case, the substrates are plates appropriately curved to define a PV module having a convex or concave shape. Transverse dimensions of a typical PV cell are 0.156 m by 0.156 m. The intentionally-defined transverse shift between the substrates is, in one example, on the order of half a centimeter; in a related embodiment is can be as large as several centimeters.

Non-limiting examples of the implementation of the idea of the invention are illustrated in FIGS. 8A, 8B, 8C, 8D, 9A, and 9B.

Figure 8A:
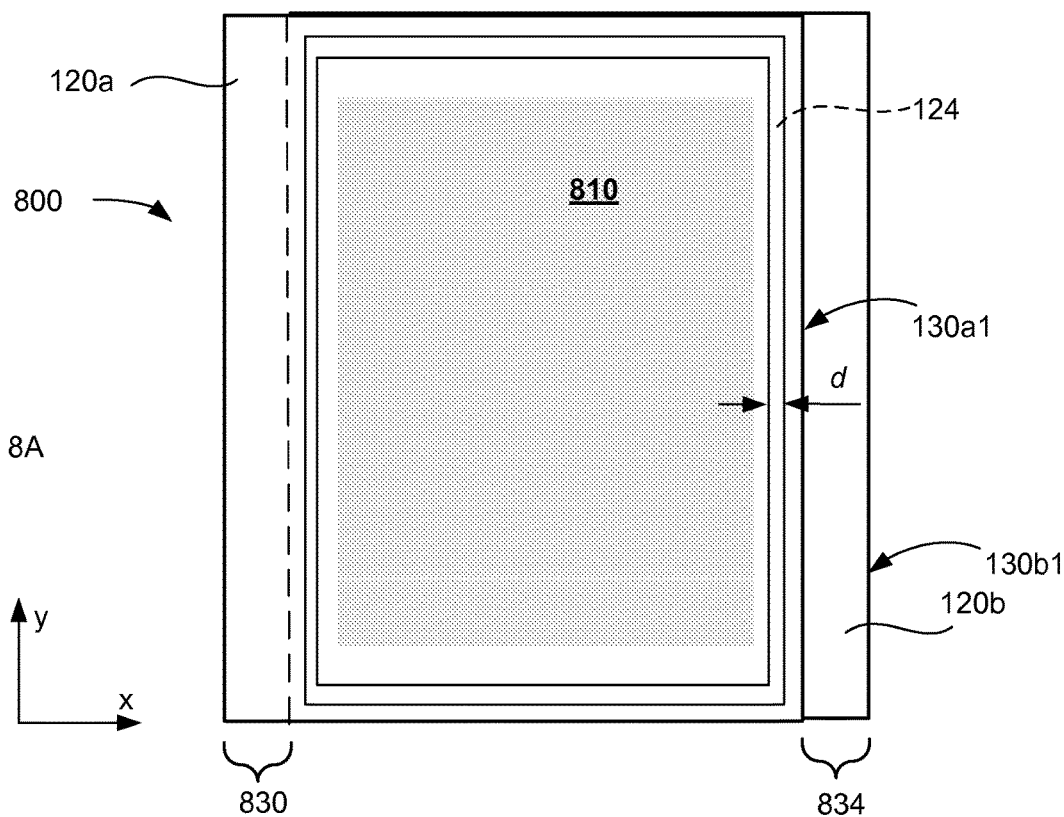
FIGS. 8A, 8B illustrate a related embodiment of the invention in top and side views.
Figure 8B:
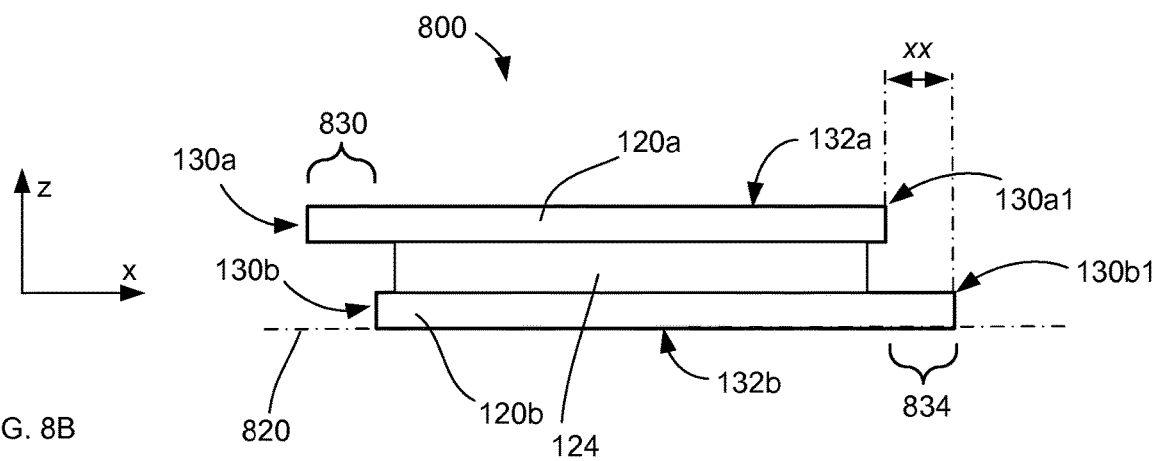

As shown in top and side views of FIGS. 8A, 8B, for example, an embodiment 800 of the PV module is bound by the two substrates 120a, 120b that are substantially equally dimensioned but intentionally shifted transversely with respect to one another (as shown—along x-axis) by a distance xx. The amount of such intentional transverse shift exceeds the amount of incidental shift that may occur during the assembly of the embodiment 100 of FIGS. 1A, 1B, and in one implementation exceeds 5 mm. While in the embodiment 100 a footprint of the substrate 120a on a plane defined by the substrate 120b (that is, a normal projection of the substrate 120a along the z-axis on such plane) substantially co-extensive with the substrate 120b (as illustrated in FIG. 1A), the embodiment 800 is structured differently. Here, while a first footprint (of the substrate 120a on a plane defined by the substrate 120b—that is, a normal projection of the substrate 120a along the z-axis on plane shown as 820) and a second footprint (a normal projection of the substrate 120b on the same plane) are substantially equally dimensioned rectangles, these footprints are not co-extensive but are shifted with respect to one another along one extent of the substrates (in this case—along x-axis) such that normal projections of the edges 130a1 and 130b1 on plane 820 are parallel to one another and separated by the distance xx. The term "co-extensive" is defined as "having the same spatial boundaries". The area 810, bounded by the substrates 120a, 120b and the ring 124 of the sealing material, contains at encapsulated PV cell layer including at least one PV cell (by analogy with the area 110 discussed in reference to FIGS. 1A, 1B). So disposed, an upper substrate (as shown—substrate 120a) forms an "overhang" or visor 830 over the lower substrate (as shown—substrate 120b), while on an opposite side of the module a corresponding portion of the lower substrate forms a "lip" 834 protruding from under the upper substrate.

Accordingly, FIGS. 8A and 8B illustrate a photovoltaic module that includes first and second optically transparent substrates. The first optically transparent substrate has a first longitudinal extent defined by first and second edges of the substrates that are substantially parallel to one another. The first substrate also has a first transverse extent defined by third and fourth edges that are substantially parallel to one another. The second optically transparent substrate has a second longitudinal extent defined by fifth and sixth edges that are substantially parallel to one another and a second transverse extent defined by seventh and eighth edges that are substantially parallel to one another. The first longitudinal extent is substantially equal to the second longitudinal extent, and the first transverse extent is substantially equal to the second transverse extent. Between the first and second substrate there is an operationally-active layer including a PV cell—whether monofacial or bifacial—and a ring of sealing material sealingly attaching the first and second substrates to one another along the perimeter of the operationally-active layer. The PV module is configured such that at least one of the following conditions is satisfied: (i) a first line representing a normal projection of the first edge on a plane defined by the second substrate is substantially parallel to and separated from a line representing the fifth edge; and (ii) a second line representing a normal projection of the third edge on a plane defined by the second substrate is substantially parallel to and offset by a second distance from a line representing the seventh edge.

The purpose of the above-identified intentional transversely-shifted disposition of the substrates 120a, 120b during the construction of the embodiment 800 is to facilitate a specific configuration of an array of the PV modules, in which the two immediately neighboring PV modules are judiciously sequenced to ensure an overlap between a visor of one module with a lip of another. FIG. 8C shows a side view of an array 850 of the PV modules drawn not to scale and structured according to an embodiment of the invention. Individual modules 852A, 852B, 852C are positioned to form a string of the modules along the x-axis such that an intentionally formed visor of an upper substrate of one module overlaps with an intentionally formed lip of a neighboring module. Ellipses 854 indicate the presence of additional modules in the array. At least a portion of the gap between the overlapping portions of substrates of the immediately neighboring modules is filled with an adhesive and/or sealing material 860 with a purpose of sealing/protection again the atmosphere elements and/or mechanically bonding the overlapping modules to one another to increase the overall structural stability of the module array. At least those residual gaps or openings 866 (between the corresponding edges and edge surfaces of the immediately neighboring modules of the array 850) that, in operation of the array, are disposed upwards and towards the Sun may be additionally covered/sealed with additional sealant 870 (such as, for example, with a weather-sealing tape and/or U, T or otherwise shaped gasket; the latter additionally cushioning the two immediately neighboring modules from hitting each other); at least some of the gaps on the lower side of the array may be covered as well. For simplicity of illustration, only gaps 866 on the upper side of the array 850 are shown protected with the sealant 870.

A specific implementation, in which the optionally flexible gasket or other sealing material 878 is interposed between the outer-portions (the ones installed to face the sky, in operation) of the two immediately neighboring modules 852A, 852B, to provide for sealing protection against the atmospheric elements and/or be configured as a mechanical buffer to protect the edge surfaces of the corresponding substrates of the modules 852A, 852B from directly contacting each other. The lower surface 880 of the gasket 878 may optionally extend all the way to the surface a of the underlying substrate. While the gap (marked as 866 in FIG. 8D) between the opposing, "bottom" substrates is not shown to be filled with a flexible sealing material, it can be if desired.

Figure 8E:
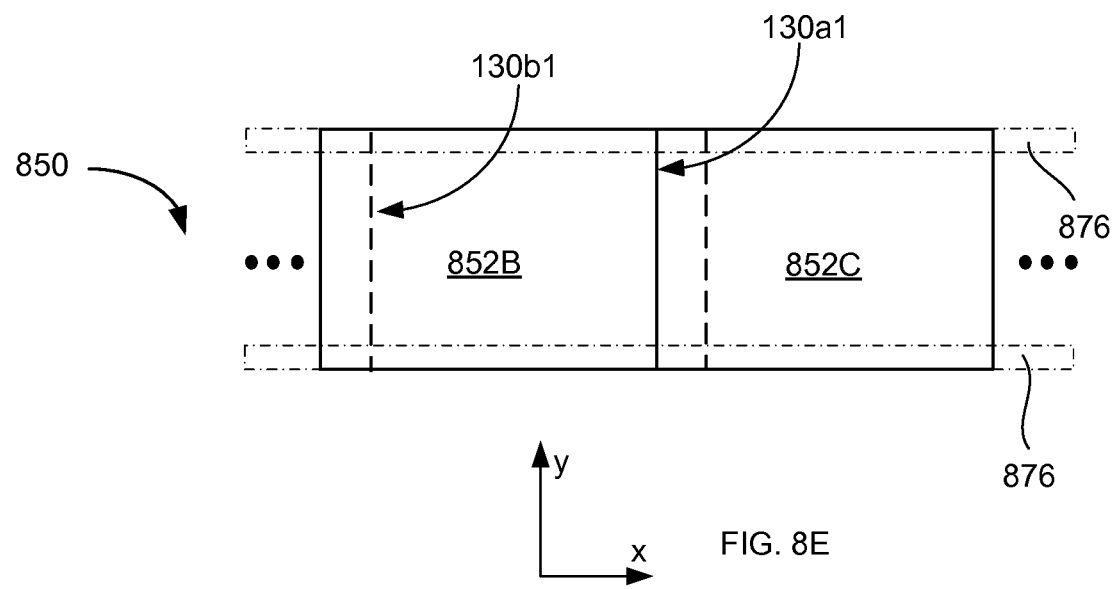
FIG. 8E illustrates a simplified external supporting structure for use with an embodiment of the PV module array of FIG. 8C.

Referring again to FIGS. 8A through 8D, the array 850 is assembled in such orientation that electrical junction boxes 610 of the individual modules (not shown) are disposed on the side which, in operation, is turned away from the sky. Due to the presence of the overlap of the substrates belonging to the neighboring modules, one of the neighboring modules mechanically supports the structure of another. As a result, the only external load-supporting structure, required by the string 850 of overlapped (tiled upon one another) PV modules during the installation for operation, is two rails or beams 876 extended along the x-axis under the opposing edges of the array, as schematically shown in FIG. 8E. Such simplification of the external supporting structure afforded by a configuration of the embodiment of the invention is operably and cost-wise advantageous as compared with a supporting structure required by a PV-module array that is composed of individual PV-modules 100, for example, dimensioned without the intentional offset dd (which includes supporting rail or beams extending along the edges of individual modules both in x- and y-directions).

Figure 9A:
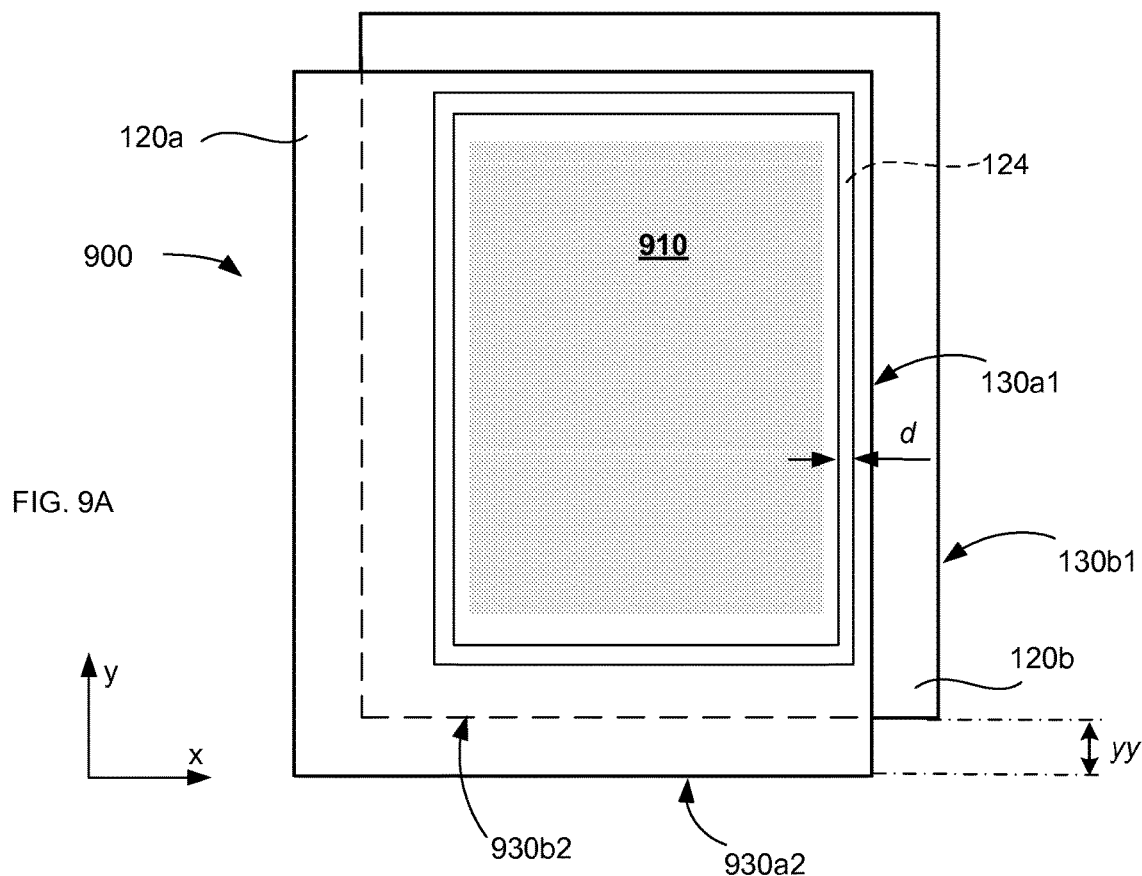
FIGS. 9A, 9B present another related embodiment of a PV module of the invention.
Figure 9B:
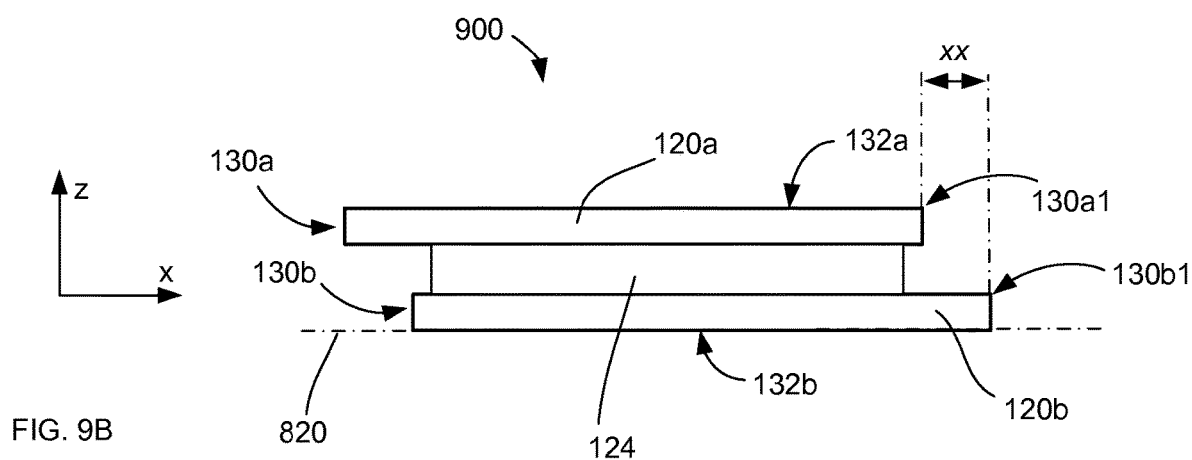

It is appreciated that in a related embodiment 900 the two substrates 120a, 120b can be disposed to define two intentional offsets, yy and xx (along the extents of the module corresponding to y- and x-axes, respectively), as schematically shown in FIGS. 9A, 9B. An array of such PV modules is assembled to define a structure in which a visor formed by an upper substrate of one module along each of the x- and y-axes is overlapped with a respectively-corresponding lip formed by a lower substrate of an immediately-neighboring module. The size of each of such offsets, in one implementation, is at least 5 mm or more, to provide for proper inter-gap sealing (the gaps defined between the so-overlapping portions of the substrates are at least partially filled with the sealing/adhesive material, as discussed previously).

Figure 10:
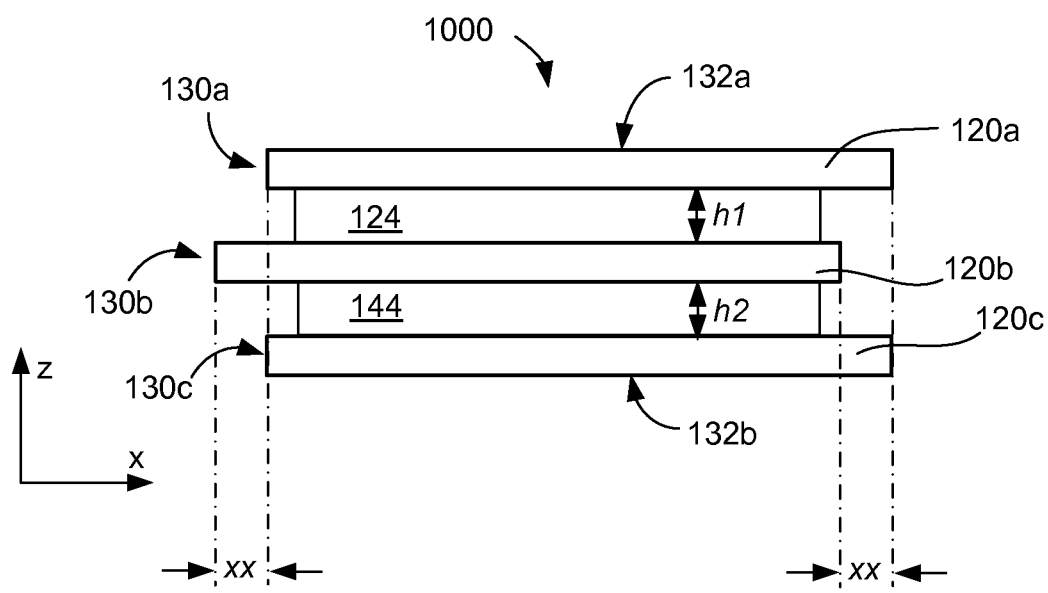
FIG. 10 illustrates a related embodiment of the PV module utilizing three substrates.

Furthermore, a person of ordinary skill in the art would readily understand that the idea of the invention can be extended to a "triple-substrate" structure of a PV-module (such as that of FIG. 1C, for example. In this case, the middle of the three substrates is transversely shifted (offset) with respect to both of the outer substrates, either along one or both of the extents of the PV-module, to provide for appropriate mating of the two or more PV modules into a 1D or 2D array of the PV modules by analogy with those disclosed above. A schematic diagram of an individual "triple-substrate" PV module 1000 configured to implement the idea of the invention is shown in FIG. 10. It is understood, therefore, that, in comparison with an embodiment of FIGS. 8A, 8B, 9A, 9B, the embodiment of FIG. 10 additionally provides for a third optically transparent substrate that has first longitudinal extent (defined by ninth and tenth edges that are substantially parallel to one another) and first transverse extent (defined by eleventh and twelfth edges that are substantially parallel to one another). In this case, the first and third substrates are disposed in parallel to one another and on opposite sides of the second substrate. A first polygon representing a normal projection of a perimeter of the first substrate on the plane defined by the second substrate is substantially co-extensive with a second polygon representing a normal projection of a perimeter of the third substrate on said plane. In this embodiment, one or more second PV cells can be disposed in a volume between the second and third substrates. The second and third substrates are sealed with a second flexible sealing material disposed therebetween between along a perimeter of the operationally-active layer that contains the second PV cells, to sealingly attach said second and third substrates to one another.

While the preferred embodiments of the present invention have been illustrated in detail, it should be apparent that modifications and adaptations to those embodiments may occur to one skilled in the art without departing from the scope of the present invention.

For example, an a related embodiment (not shown), a frameless PV module may include an array of sub-PV-modules that are both mechanically and electrically connected through flexible joints and, optionally, have an overlaying cover layer shaped to include a dome-like structure. Implementations of flexible PV modules are discussed, for example, in the co-assigned U.S. patent application Ser. No. 13/675,855. Similarly, a related embodiment of the invention may include various encapsulating means directed to protect PV cell array from being exposed to the ambient as discussed, for example, in a co-assigned U.S. patent application Ser. No. 13/682,119. Disclosure of each of these two patent applications are incorporated herein by reference in its entirety. A PV module containing any of the additional elements and features disclosed in patent documents incorporated by reference herein are within the scope of the present invention.

The invention claimed is:

1. A photovoltaic (PV) module system comprising:
    a photovoltaic module having a first optically transparent substrate and a second optically transparent substrate bounding a cavity therebetween;
    a crystalline silicon PV cell located in said cavity between said first substrate and said second substrate;
    said PV cell being a first cell of a plurality of electrically interconnected PV cells disposed between said first substrate and said second substrate,
    a peripheral area around said plurality of electrically interconnected PV cells lacking a PV cell and defining a closed band, a width of said closed band corresponding to a difference between a transverse dimension of the PV module and a transverse dimension of plurality of electrically interconnected PV cells;
    a sealing material disposed in said cavity between said first substrate and said second substrate around a perimeter of said PV module to provide a substantially moisture proof seal around said perimeter of said PV module and sealingly affixing said first substrate to said second substrate; and
    a hole through said first substrate and/or said second substrate and an electrically conducting member electrically connected to the crystalline PV cell and passing through said hole.

2. The system of claim 1 wherein said plurality of PV cells comprise bifacial PV cells.

3. The system of claim 1 wherein said seal comprises an encapsulant covering a photo-voltaically operable surface of the plurality of PV cells.

4. The system of claim 1 further comprising an encapsulant covering a photovoltaically operable surface of the plurality of PV cells, said seal being located peripherally relative to said encapsulant.

5. The system of claim 1 further comprising an external supporting structure for holding said module located at a plurality of locations on a perimeter of said PV module, said supporting structure extending inwardly from said perimeter to cover a portion of said closed band.

6. The system of claim 5 wherein said supporting structure extends inwardly from said perimeter less than said width of said closed band.

7. The system of claim 6 wherein said supporting structure comprises a plurality of clamps separated from each other along said perimeter.

8. The system of claim 1 wherein said PV module is devoid of any structural frame around said perimeter.

9. The system of claim 1 wherein said PV module is devoid of a substantially rigid housing.

10. The system of claim 1, further comprising an electrical junction box coupled to the module such that, in operation, a shadow of said electrical junction box cast by sunlight does not fall on a PV cell of the plurality of PV cells.

11. The system of claim 10 wherein said electrical junction box is located outside said cavity and laterally relative to said plurality of PV cells in a direction parallel to a longitudinal dimension of said first substrate and/or said second substrate.

12. The system of claim 10 wherein said electrical junction box is located outside said cavity and mounted at a perimeter of said first substrate and/or said second substrate.

13. The system of claim 1 wherein a dimensional extent of said seal is substantially equal to a dimensional extent of said PV module.

14. The system of claim 1, wherein said first substrate and said second substrate are glass plane-parallel plates.

15. The system of claim 1 further comprising an electrically conducting member electrically connected to the crystalline PV cell and extending laterally through an edge of the cavity to connect to a junction box located at an edge of said first substrate and/or said second substrate.

16. The system of claim 1 wherein said PV module is ungrounded electrically and conductively during operation.

17. A photovoltaic (PV) module system comprising:
a photovoltaic module having a first optically transparent substrate and a second optically transparent substrate bounding a cavity therebetween, said first substrate and said second substrate providing all of a structural rigidity of said module;
a crystalline silicon PV cell located in said cavity between said first substrate and said second substrate;
said crystalline silicon PV cell being a first cell of a plurality of electrically interconnected PV cells disposed between said first substrate and said second substrate;
an encapsulant material covering photovoltaically operable surfaces of the plurality of electrically interconnected PV cells, a substantially moisture proof seal disposed in said cavity around said perimeter of said PV module and sealingly affixing said first substrate to said second substrate; and
a hole through said first substrate and/or said second substrate and an electrically conducting member electrically connected to said crystalline PV cell and passing through said hole.

18. The system of claim 17 wherein said plurality of PV cells comprise bifacial PV cells.

19. The system of claim 17, wherein said first substrate and said second substrate are glass plane-parallel plates.

20. The system of claim 17 wherein said electrical junction box is located outside said cavity and laterally relative to said plurality of PV cells in a direction parallel to a longitudinal dimension of said first substrate and/or said second substrate.

21. The system of claim 17 wherein said electrical junction box is located outside said cavity and mounted at a perimeter of said first substrate and/or said second substrate.

22. The system of claim 17 wherein said seal is flush with outside edges of said first substrate and said second substrate.

23. The system of claim 18 wherein said PV module is ungrounded electrically and conductively during operation.

24. The system of claim 17 further comprising a peripheral area around said plurality of electrically interconnected PV cells lacking a PV cell and defining a closed band, a width of said closed band corresponding to a difference between a transverse dimension of the PV module and a transverse dimension of plurality of electrically interconnected PV cells.

* * * * *